United States Patent
Orita et al.

(10) Patent No.: US 10,020,439 B2
(45) Date of Patent: Jul. 10, 2018

(54) ELECTROSTRICTIVE ELEMENT

(71) Applicant: HONDA MOTOR CO., LTD., Tokyo (JP)

(72) Inventors: Atsuo Orita, Saitama (JP); Hidefumi Nikawa, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 373 days.

(21) Appl. No.: 14/724,232

(22) Filed: May 28, 2015

(65) Prior Publication Data

US 2016/0351785 A1    Dec. 1, 2016

(51) Int. Cl.
| H01L 41/053 | (2006.01) |
| H01L 41/113 | (2006.01) |
| H01L 41/107 | (2006.01) |
| H01L 41/29 | (2013.01) |
| H01L 41/047 | (2006.01) |
| H01L 41/083 | (2006.01) |
| H01L 41/193 | (2006.01) |
| H01L 41/00 | (2013.01) |

(52) U.S. Cl.
CPC ...... H01L 41/0478 (2013.01); H01L 41/0472 (2013.01); H01L 41/0536 (2013.01); H01L 41/0835 (2013.01); H01L 41/193 (2013.01)

(58) Field of Classification Search
CPC .......... H01L 41/0478; H01L 41/0472; H01L 41/0536; H01L 41/0835; H01L 41/193; H01L 41/0833; H02N 1/002
USPC .......................................... 310/309; 200/181
See application file for complete search history.

(56) References Cited

U.S. PATENT DOCUMENTS

| 6,664,718 | B2* | 12/2003 | Pelrine | F04B 35/00 310/330 |
| 7,259,503 | B2* | 8/2007 | Pei | F02G 1/043 310/330 |
| 8,384,271 | B2* | 2/2013 | Kwon | G02B 3/14 310/328 |
| 8,797,654 | B2* | 8/2014 | Blum | G02B 3/14 359/666 |
| 9,476,782 | B2* | 10/2016 | Suzuki | B82Y 30/00 |
| 9,642,258 | B2* | 5/2017 | Diao | H05K 1/162 |
| 2008/0067681 | A1* | 3/2008 | Tseng | H01L 21/28562 257/758 |
| 2008/0211101 | A1* | 9/2008 | Han | B82Y 10/00 257/752 |
| 2011/0057322 | A1* | 3/2011 | Matsunaga | H01L 21/76814 257/774 |
| 2011/0278040 | A1 | 11/2011 | Zhang et al. | |
| 2013/0333374 | A1* | 12/2013 | Chen | F03G 7/005 60/528 |

(Continued)

FOREIGN PATENT DOCUMENTS

| DE | 60037433 T2 | 12/2008 | |
| DE | 102016208984 A1* | 12/2016 | ......... H01L 41/0478 |

(Continued)

OTHER PUBLICATIONS

German Office Action dated Dec. 2, 2016 with English Translation, 17 pages.

(Continued)

Primary Examiner — Edgardo San Martin
(74) Attorney, Agent, or Firm — Rankin, Hill & Clark LLP

(57) ABSTRACT

An electrostrictive element that can prevent the breakage includes a current collector that is constituted by sheet-shaped carbon nanotube aggregates, and can expand in the fiber direction in a state in which carbon nanotubes overlap with each other, when a dielectric film expands.

9 Claims, 3 Drawing Sheets

(56) References Cited

U.S. PATENT DOCUMENTS

| | | | | |
|---|---|---|---|---|
| 2014/0331793 | A1* | 11/2014 | Suzuki | B82Y 30/00 |
| | | | | 73/862.629 |
| 2014/0340762 | A1* | 11/2014 | Blum | G02B 3/14 |
| | | | | 359/666 |
| 2016/0072071 | A1* | 3/2016 | Yumura | H01L 51/0047 |
| | | | | 320/101 |
| 2016/0348774 | A1* | 12/2016 | Orita | F16H 25/20 |
| 2016/0351782 | A1* | 12/2016 | Orita | H01L 41/0478 |
| 2016/0351784 | A1* | 12/2016 | Cutkosky | H01L 41/047 |
| 2016/0351790 | A1* | 12/2016 | Cutkosky | B41F 15/00 |
| 2016/0352254 | A1* | 12/2016 | Orita | H01L 41/0986 |

FOREIGN PATENT DOCUMENTS

| | | | | |
|---|---|---|---|---|
| JP | 2003-174205 | | 6/2003 | |
| JP | 2016225599 A | * | 12/2016 | ......... H01L 41/0478 |
| JP | 2016225600 A | * | 12/2016 | ........... H01L 41/047 |
| JP | 2016225601 A | * | 12/2016 | ......... H01L 41/0478 |
| WO | 2007/015710 A2 | | 2/2007 | |

OTHER PUBLICATIONS

Zhang, et al. "Assembly of Carbon Nanotubes Sheets"; Electronic Properties of Carbon Nanotubes; Edited by Prof. Jose Mauricio Marulanda. 2011-ISBN: 978-953-307-499-3; URL: http:/www.intechopen.com/books/electronic-properties-of-carbon-nanotubes/assembly-of-carbon-nanotube-sheets.

X. Lepro, et al. "Spinnable Carbon Nanotube Forests Grow on Thin, Flexible Metallic Substrates"; Carbon 48 (2010), p. 3621-3627—doi:10. 1016/j. carbon. 2010.06.016.

German Search Report dated Dec. 2, 2016, along with English Translation, 19 pages.

* cited by examiner

ELECTROSTRICTIVE ELEMENT

BACKGROUND OF THE INVENTION

Field of the Invention

The present invention relates to an electrostrictive element.

Description of the Related Art

It is known that, when electrodes are connected with both front and back surfaces of a dielectric film composed of an elastomer and voltage is applied, the dielectric film is subjected to compressive force by the Maxwell stress (piezoelectric inverse effect) from the interfacial polarization due to electrostatic force, contracts in the thickness direction and expands in the lateral direction (the direction orthogonal to the thickness direction). In recent years, there has been considered an electrostrictive element that comprises a dielectric film and electrodes and that is driven by this principle.

As such an electrostrictive element, there has been proposed a dielectric-based drive device comprising a dielectric film that is composed of an elastomer, film electrodes that are formed inside the peripheral edges of both front and back surfaces of the dielectric film and that can expand and contract so as to follow the expansion and contraction of the dielectric film, a rim type frame that is provided on the peripheral edge of one surface of the dielectric film and that keeps the dielectric film in an expansion state, current collectors that are connected with the peripheral edges of the film electrodes (see Japanese Patent Laid-Open 2003-174205, for example). The current collectors, each of which has one end connected with the peripheral edge of the film electrode and has another end extend outside the dielectric film, supply electricity to the film electrodes.

In the electrostrictive element, when a positive or negative voltage is applied to the film electrodes through the current collectors, the dielectric film contracts in the thickness direction and expands in the lateral direction. However, since the peripheral edge of the dielectric film is kept by the rim type frame, the dielectric film expands inward due to the restriction of the outward expansion, and projects to the side of one surface so as to have a nearly mountain shape as a whole. Then, the film electrodes expand so as to follow the behavior of the dielectric film for the expansion, and are transformed into a nearly mountain shape.

Thereafter, by the stop of the application, the expanded dielectric film is restored to a nearly original shape, and the expanded film electrodes are restored to a nearly original shape so as to follow the behavior of the dielectric film for the restoration.

However, the current collector extends outside the film electrode and contacts with the surface of the dielectric film composed of an elastomer. Therefore, in the case where a metal plate of copper or the like is used as the current collector, disadvantageously, when the dielectric film expands and contracts repeatedly, the surface of the dielectric film is damaged by corner portions of the plate-shaped current collector, and there is a fear that the dielectric film is broken from the portions.

Further, in the electrostrictive element, when the film electrode expands with the expansion of the dielectric film, a load is given to the current collector connected with the peripheral edge of the film electrode, and there is a fear that the current collector or the connection portion between the current collector and the film electrode is broken.

The present invention has an object to solve such disadvantages and to provide an electrostrictive element that can prevent the breakage.

SUMMARY OF THE INVENTION

For achieving the above object, an electrostrictive element according to the present invention comprises: a dielectric film that is composed of an elastomer; film electrodes that are formed inside peripheral edges of both front and back surfaces of the dielectric film and that can expand and contract so as to follow expansion and contraction of the dielectric film; a rim type frame that is provided on the peripheral edge of at least one surface of the dielectric film and that keeps the dielectric film in an expansion state; and current collectors each of which has one end connected with a peripheral edge of the film electrode and has another end extend outside the dielectric film, in which the current collector is a sheet-shaped carbon nanotube aggregate or a string-shaped carbon nanotube aggregate, and is provided such that a fiber direction of the carbon nanotube aggregate coincides with the expansion-and-contraction direction of the dielectric film, the sheet-shaped carbon nanotube aggregate being a carbon nanotube aggregate in which a plurality of carbon nanotubes are oriented in the fiber direction in a state of overlapping with each other in the fiber direction, the string-shaped carbon nanotube aggregate being a carbon nanotube aggregate in which the plurality of carbon nanotubes are oriented in the fiber direction in the state of overlapping with each other in the fiber direction and are aggregated in a radial direction, and the carbon nanotube aggregate can expand in the fiber direction while maintaining the state of overlapping with each other, when the dielectric film expands.

In the electrostrictive element according to the present invention, when a positive or negative voltage is applied to the film electrodes through the current collectors, the dielectric film expands inward due to the restriction of the outward expansion and projects to the side of one surface so as to have a nearly mountain shape as a whole, because the peripheral edge of the dielectric film is kept by the rim type frame. Then, the film electrodes expand so as to follow the behavior of the dielectric film for the expansion, and are transformed into a nearly mountain shape.

Thereafter, by the stop of the application, the expanded dielectric film is restored to a nearly original shape, and the expanded film electrodes are restored to a nearly original shape so as to follow the behavior of the dielectric film for the restoration.

The current collector extends outside the film electrode and contacts with the surface of the dielectric film composed of an elastomer. However, the sheet-shaped carbon nanotube aggregate or string-shaped carbon nanotube aggregate composed of the carbon nanotubes, which constitutes the current collector, has a lower rigidity compared to a metal plate of copper or the like, and therefore, even when the dielectric film expands and contracts repeatedly, the surface of the dielectric film is not damaged by the current collector.

Further, when the film electrode expands with the expansion of the dielectric film, the current collector can expand in the fiber direction while maintaining the state in which the plurality of carbon nanotubes overlap with each other in the fiber direction, and therefore, no load is given to the current collector, and it is possible to prevent the breakage of the current collector or the connection portion between the current collector and the film electrode.

Therefore, in the electrostrictive element according to the present invention, it is possible to prevent the breakage.

By the way, in the electrostrictive element according to the present invention, the current collector is provided so as to pass between the dielectric film and the rim type frame, in some cases. The rim type frame cannot keep the dielectric film at a portion where the current collector passes, and sometimes prevents the expansion of the dielectric film.

Hence, in the electrostrictive element according to the present invention, it is preferable that the current collector have a plurality of the carbon nanotube aggregates provided at intervals from each other. According to the configuration, even at the portion where the current collector passes, the rim type frame can keep the dielectric film in the intervals of the plurality of the carbon nanotube aggregates, and therefore, it is possible to surely expand the dielectric film.

Further, in the electrostrictive element according to the present invention, a plurality of the dielectric films may be laminated in a thickness direction.

In the electrostrictive element according to the present invention, for example, it is preferable that the carbon nanotube aggregate have a thickness of 0.04 to 0.3 µm, and thereby, it is possible to obtain elasticity and conductivity. In the carbon nanotube aggregate, in the case where the thickness is less than 0.04 µm, it is sometimes difficult to ensure the conductivity, and in the case of exceeding 0.3 µm, it is sometimes difficult to ensure the elasticity.

Further, for example, it is preferable that the carbon nanotube composing the carbon nanotube aggregate have a diameter in a range of 0.4 to 50 nm and have a length in a range of 0.4 to 10 µm, and thereby, it is possible to obtain elasticity and conductivity. It is difficult to form the carbon nanotube such that it has a diameter less than 0.4 nm, and in the case of exceeding 50 nm, it is sometimes impossible to obtain the property of the carbon nanotube. Further, in the case where the carbon nanotube has a length less than 0.4 µm, it is difficult for the carbon nanotubes to maintain a single orientation while overlapping with each other when the dielectric film expands. Alternatively, rather, it is sometimes impossible to ensure the elasticity due to the enhancement of the tensile rigidity by the increase in the contact quantity between the carbon nanotubes. In the case of exceeding 10 µm, the conductivity decreases by the expansion and the effect decreases, in some cases.

Further, in the electrostrictive element according to the present invention, a dielectric film including a kind of resin material selected from a group consisting of silicone, polyurethane and polyethylene can be used as the dielectric film.

Further, the dielectric film, on at least one surface, may comprise an adhesion layer composed of an adhesive or an acrylic adhesive whose base compound is a same resin material as the resin material composing the dielectric film. In this case, by the adhesion layer, the film electrodes can suitably adhere to the dielectric film. Furthermore, since the adhesion layer has an elasticity and relative permittivity equal to or higher than the resin material composing the dielectric film, the elasticity and relative permittivity of the dielectric film are not inhibited.

Further, a flexible material containing any of a platinum-supported carbon material, silver and copper can be used as the film electrode.

Further, a kind of resin material selected from a group consisting of ABS (acrylonitrile-butadiene-styrene copolymer), polyacetal, polyether ketone and a glass-fiber reinforced resin, or a kind of inorganic material selected from a group consisting of a reinforced glass and a ceramic that include a compressive layer on a surface can be used as the rim type frame.

DETAILED DESCRIPTION OF THE PREFERRED EMBODIMENT

Next, an embodiment of the present invention will be described in further detail, with reference to the accompanying drawings.

Figure 1:
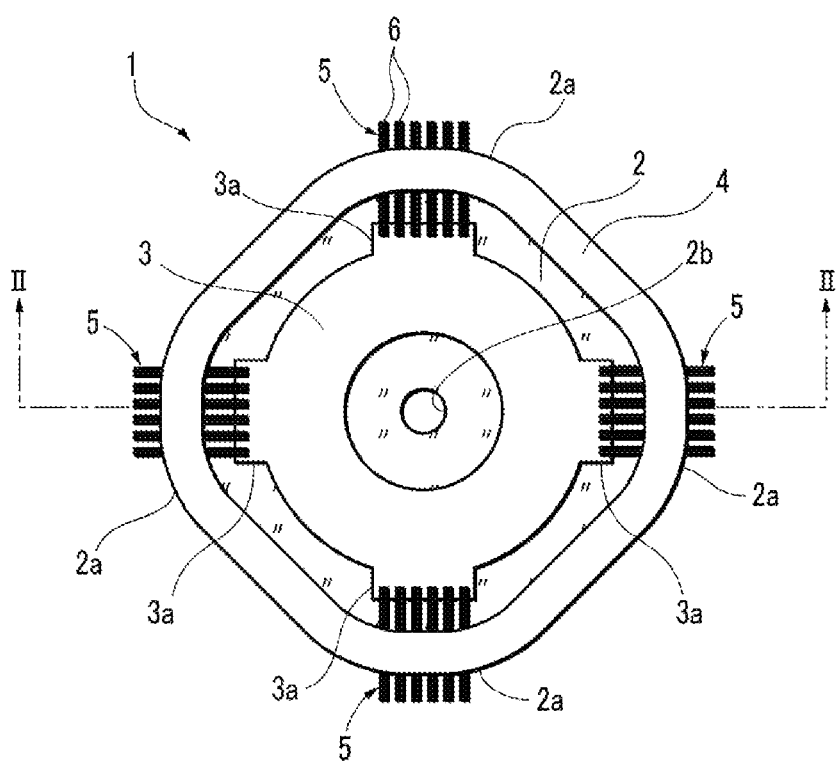
FIG. 1 is a plan view showing an electrostrictive element according to the present invention.
Figure 2:
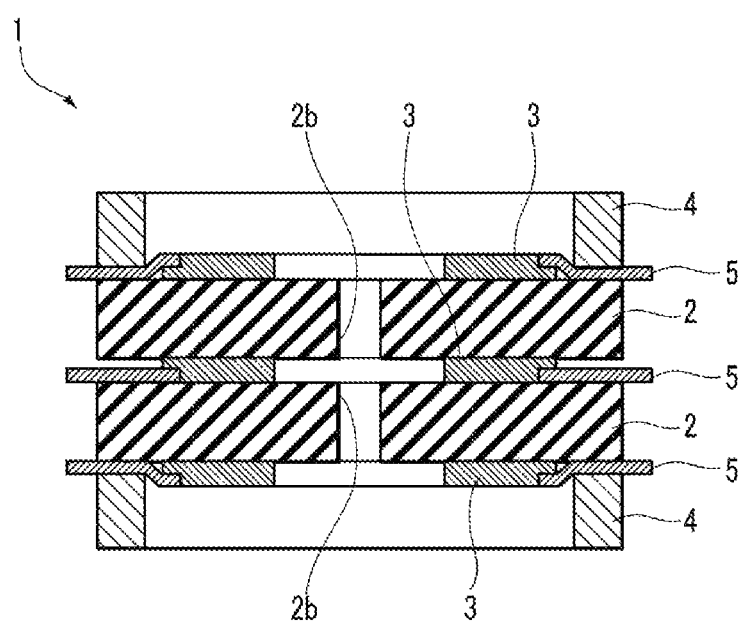
FIG. 2 is a cross-section view taken from line II-II in FIG. 1.

An electrostrictive element 1 according to the embodiment shown in FIG. 1 and FIG. 2 comprises two dielectric films 2 composed of an elastomer, film electrodes 3 formed inside peripheral edges of each of the dielectric films 2, a rim type frame 4 to keep each of the dielectric films 2 in an expansion state, and current collectors 5 to supply electricity to each of the film electrodes 3.

Each dielectric film 2 has a nearly square shape in which corner portions 2a are rounded off and a through hole 2b is provided at the center, and is composed of an elastomer having a thickness of 20 to 100 µm, for example. The dielectric film 2 may have a circular shape instead of the nearly square shape.

As the elastomer to be used for each dielectric film 2, for example, a resin material including silicone, polyurethane and polyethylene can be used. For adjusting the permittivity of the dielectric film 2, a dielectric material such as barium titanate may be further included. Further, an adhesive layer composed of an adhesive or an acrylic adhesive whose base compound is the same resin material as the resin material composing the dielectric film 2 may be provided on one or both sides of the resin material. The embodiment uses a sheet (the trade name of VHB 4910 (thickness 1000 µm) or the trade name of VHB 4905 (thickness 500 µm), both manufactured by 3M) composed of a polyethylene film on which an adhesion layer composed of an acrylic adhesive is provided. The film electrodes 3 adhere to both front and back surfaces of each of the dielectric films 2.

The film electrode 3, which has a circular shape, has a shape including projecting portions 3a that are portions facing the corner portions 2a of the dielectric film 2 and that project outward. As the film electrode 3, for example, a flexible material that has a thickness of 8 to 50 µm and that is obtained by a film formation treatment such as a screen printing with use of a conductive paste containing a platinum-supported carbon material, silver, copper or the like as an ink can be used. The film electrode 3 can expand and contract so as to follow the expansion and contraction of the dielectric film 2.

The rim type frame 4 is composed of, for example, a kind of resin material selected from the group consisting of ABS (acrylonitrile-butadiene-styrene copolymer), polyacetal, polyether ketone and a glass-fiber reinforced resin, or a kind of inorganic material selected from the group consisting of a reinforced glass and a ceramic that include a compressive layer on the surface, and has an insulation property. The rim type frame 4 adheres to the peripheral surfaces of the upper surface of the dielectric film 2 on the upper side and the lower surface of the dielectric film 2 on the lower side, and keeps the dielectric films 2 in an expansion state.

In the current collector 5, which has a predetermined length, one end is connected with the peripheral edge of the projecting portion 3a of the film electrode 3, and the other end passes between the dielectric film 2 and the rim type frame 4 and extends outside the dielectric film 2.

The current collector 5 is constituted by six carbon nanotube aggregates 6. Each carbon nanotube aggregates 6 are provided so as to be nearly parallel to the direction (lateral direction) orthogonal to the thickness direction of the dielectric film 2 and the film electrode 3, and therewith, are provided at intervals from each other. Therefore, the rim type frame 4 can adhere to the dielectric film 2 in the intervals of the carbon nanotube aggregates 6, and can surely keep the expansion state of the dielectric film 2.

Figure 3A:
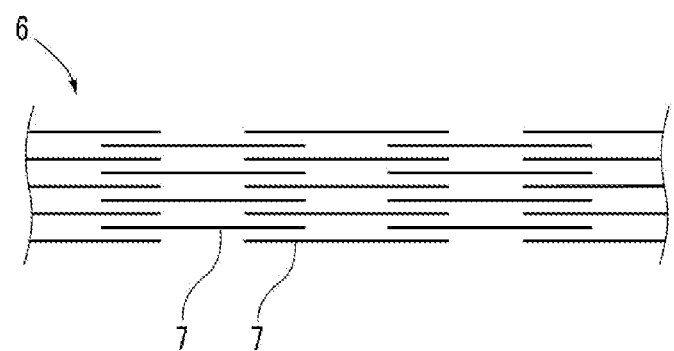
FIG. 3A is a diagram schematically showing a carbon nanotube aggregate before expansion.

As shown in FIG. 3A, in the carbon nanotube aggregate 6, which is formed so as to have a length of 1 to 100 µm and a thickness of 0.04 to 0.3 a plurality of carbon nanotubes 7 having a diameter of 0.4 to 50 nm and a length of 0.4 to 10 µm are oriented in the fiber direction in a state of overlapping with each other in the fiber direction.

The carbon nanotube aggregate 6 has a sheet shape in which the plurality of carbon nanotubes 7 are oriented in the fiber direction in the state of overlapping with each other in the fiber direction, or a string shape in which the plurality of carbon nanotubes 7 are oriented in the fiber direction in the state of overlapping with each other in the fiber direction and are aggregated in the radial direction.

As the sheet-shaped carbon nanotube aggregate 6, for example, there is known a carbon nanotube aggregate that is formed by orderly pulling, with a pullout unit of a roller, a plurality of carbon nanotubes from a carbon nanotube forest in which the plurality of the carbon nanotubes have grown on a substrate, similarly to the method disclosed in FIG. 53 of the pamphlet of International Publication No. WO 2007/015710.

Further, as the string-shaped carbon nanotube aggregate 6, there is known a carbon nanotube aggregate that is formed by orderly pulling the plurality of carbon nanotubes from the carbon nanotube forest with the pullout unit of the roller and further aggregating them in the radial direction without twisting them.

Figure 3B:
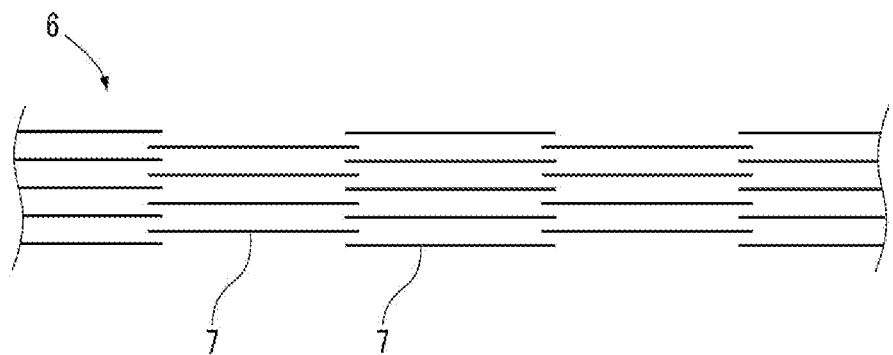
FIG. 3B is a diagram schematically showing the carbon nanotube aggregate after expansion.

As described later, the carbon nanotube aggregate 6 can expand in the fiber direction while maintaining the state in which the plurality of carbon nanotubes 7 overlap with each other in the fiber direction, as shown in FIG. 3B. Further, in the carbon nanotube aggregate 6, the fiber direction of the carbon nanotubes 7 coincides with the electricity-supplying direction of the current collector 5, and therefore, it is possible to suitably supply electricity.

In the embodiment, the current collector 5 is constituted by the six sheet-shaped or string-shaped carbon nanotube aggregates 6, but may be constituted by a single sheet-shaped carbon nanotube aggregate 6.

In the electrostrictive element 1, when a positive or negative voltage is applied to the film electrodes 3 through the current collectors 5, the dielectric films expand inward due to the restriction of the outward expansion and project to the side of one surface so as to have a nearly mountain shape as a whole, because the peripheral edges of the dielectric films 2 are kept by the rim type frame 4. On this occasion, the film electrodes 3 expand so as to follow the behavior of the dielectric films 2 for the expansion, and are transformed into a nearly mountain shape. Furthermore, in the carbon nanotube aggregates 6 constituting the current collector 5, as shown in FIG. 3B, the plurality of carbon nanotubes 7 expand in the fiber direction while maintaining the state of overlapping with each other in the fiber direction. Therefore, the expansion of the film electrodes 3 does not give a load to the current collector 5, and it is possible to prevent the breakage of the current collectors 5 or the connection portions between the current collectors 5 and the film electrodes 3.

Thereafter, by the stop of the application, the expanded dielectric films 2 are restored to a nearly original shape, and the film electrodes 3 are restored to a nearly original shape so as to follow the behavior of the dielectric films 2 for the restoration. As a result, the current collectors 5 are restored to a nearly original shape, as shown in FIG. 3A.

As shown in FIG. 2, the current collectors 5 extend outside the film electrodes 3 and contact with the surfaces of the dielectric films 2 composed of the elastomer. However, the carbon nanotube aggregate 6, which constitutes the current collectors 5, has a lower rigidity compared to a metal plate of copper or the like, and therefore, even when the dielectric films 2 expand and contract repeatedly, the surfaces of the dielectric films 2 are not damaged by the current collectors 5.

Therefore, according to the electrostrictive element 1 in the embodiment, it is possible to prevent the breakage of the current collectors 5, the connection portions between the current collectors 5 and the film electrodes 3, or the dielectric films 2.

REFERENCE SIGNS LIST

1 . . . electrostrictive element, 2 . . . dielectric film, 3 . . . film electrode, 4 . . . rim type frame, 5 . . . current collector, 6 . . . carbon nanotube aggregate, 7 . . . carbon nanotube

What is claimed is:

1. An electrostrictive element comprising:
a dielectric film that is composed of an elastomer;
film electrodes that are formed inside peripheral edges of both front and back surfaces of the dielectric film and that can expand and contract so as to follow expansion and contraction of the dielectric film;
a rim type frame that is provided on the peripheral edge of at least one surface of the dielectric film and that keeps the dielectric film in an expansion state; and
current collectors each of which has one end connected with a peripheral edge of a respective one of the film electrodes and has another end extend outside the dielectric film,
wherein the current collectors are each one of: a sheet-shaped carbon nanotube aggregate in which a plurality of carbon nanotubes are oriented in a fiber direction that coincides with an expansion-and-contraction direction of the dielectric film, in a state of overlapping with each other in the fiber direction, the sheet-shaped carbon nanotube aggregate being expandable in the fiber direction while maintaining the state of overlapping of the plurality of carbon nanotubes when the dielectric film expands; and a string-shaped carbon nanotube aggregate in which the plurality of carbon nanotubes are oriented in the fiber direction, in the state of overlapping with each other in the fiber direction, and are aggregated in a radial direction, the string-shaped carbon nanotube aggregate being expandable in the fiber direction while maintaining the state of overlapping of the plurality of carbon nanotubes when the dielectric film expands.

2. The electrostrictive element according to claim 1,
wherein the current collectors are each one of: a plurality of the sheet-shaped carbon nanotube aggregate provided on the dielectric film with an interval between each sheet-shaped carbon nanotube aggregate; and a plurality of the string-shaped carbon nanotube aggregate provided on the dielectric film with an interval between each string-shaped carbon nanotube aggregate.

3. The electrostrictive element according to claim 1,
wherein a plurality of the dielectric films are laminated in a thickness direction.

4. The electrostrictive element according to claim 1,
wherein the one of the sheet-shaped carbon nanotube aggregate and the string-shaped carbon nanotube aggregate has a thickness in a range of 0.04 to 0.3 μm.

5. The electrostrictive element according to claim 1,
wherein each of the plurality of carbon nanotubes has a diameter in a range of 0.4 to 50 nm and has a length in a range of 0.4 to 10 μm.

6. The electrostrictive element according to claim 1,
wherein the dielectric film includes a kind of resin material selected from a group consisting of silicone, polyurethane and polyethylene.

7. The electrostrictive element according to claim 6,
wherein the dielectric film comprises an adhesion layer on at least one surface, the adhesion layer being composed of an adhesive or an acrylic adhesive whose base compound is a same resin material as the resin material composing the dielectric film.

8. The electrostrictive element according to claim 1,
wherein the film is electrodes are composed of a flexible material containing any of a platinum-supported carbon material, silver and copper.

9. The electrostrictive element according to claim 1,
wherein the rim type frame is composed of a kind of resin material selected from a group consisting of ABS (acrylonitrile-butadiene-styrene copolymer), polyacetal, polyether ketone and a glass-fiber reinforced resin, or a kind of inorganic material selected from a group consisting of a reinforced glass and a ceramic that include a compressive layer on a surface.

* * * * *